United States Patent
Botti et al.

(10) Patent No.: US 10,560,082 B2
(45) Date of Patent: Feb. 11, 2020

(54) PULSE WIDTH MODULATION CIRCUIT, CORRESPONDING DEVICE AND METHOD

(71) Applicant: STMicroelectronics S.r.l., Agrate Brianza (IT)

(72) Inventors: Edoardo Botti, Vigevano (IT); Noemi Gallo, Bareggio (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 16/151,380

(22) Filed: Oct. 4, 2018

(65) Prior Publication Data
US 2019/0123731 A1   Apr. 25, 2019

(30) Foreign Application Priority Data

Oct. 19, 2017   (IT) .................. 102017000118558

(51) Int. Cl.
| | |
|---|---|
| *H03K 7/08* | (2006.01) |
| *H03F 1/26* | (2006.01) |
| *H03F 3/181* | (2006.01) |
| *H03F 3/217* | (2006.01) |
| *H03K 4/08* | (2006.01) |
| *H03K 5/1252* | (2006.01) |

(52) U.S. Cl.
CPC ............. *H03K 7/08* (2013.01); *H03F 1/26* (2013.01); *H03F 3/181* (2013.01); *H03F 3/217* (2013.01); *H03K 4/08* (2013.01); *H03K 5/1252* (2013.01); *H03F 2200/03* (2013.01)

(58) Field of Classification Search
CPC .......... H03K 7/08; H03K 4/08; H03K 5/1252; H03F 1/26; H03F 3/181; H03F 3/217; H03F 2200/03
See application file for complete search history.

(56) References Cited

U.S. PATENT DOCUMENTS

| | | | |
|---|---|---|---|
| 5,291,562 A | 3/1994 | Hata | |
| 9,595,946 B2 | 3/2017 | Raimondi et al. | |
| 9,673,762 B2* | 6/2017 | Zhang | ............. H03F 1/305 |
| 10,027,315 B2* | 7/2018 | Raimondi | ............. H03F 1/26 |

(Continued)

FOREIGN PATENT DOCUMENTS

| | | |
|---|---|---|
| EP | 1657815 A1 | 5/2006 |
| WO | 2009001254 A2 | 12/2008 |

*Primary Examiner* — Long Nguyen
(74) *Attorney, Agent, or Firm* — Slater Matsil, LLP

(57) ABSTRACT

In an embodiment, a PWM modulation circuit includes a first circuit block configured to receive a square wave input signal and produce from the square wave input signal a triangular wave signal, a second circuit block configured to receive a modulating signal and produce a PWM signal by comparing the modulating signal with a carrier signal, a switching circuit block coupled between the first circuit block and the second circuit block and sensitive to reference signals having upper and lower reference values and selectively switchable between a carrier transfer setting in which the switching circuit block couples the first circuit block to the second circuit block to transfer the triangular wave signal as the carrier signal, and one or more carrier forcing settings for optimizing or inhibiting pulse skipping in the PWM signal, wherein the switching circuit block forces the carrier signal to the upper and lower reference values, respectively.

19 Claims, 5 Drawing Sheets

(56) References Cited

U.S. PATENT DOCUMENTS

2007/0018697 A1    1/2007  Hsu et al.
2007/0024365 A1    2/2007  Ramaswamy et al.
2016/0336957 A1* 11/2016  Bernardinis .......... H03M 3/432

* cited by examiner

PULSE WIDTH MODULATION CIRCUIT, CORRESPONDING DEVICE AND METHOD

CROSS-REFERENCE TO RELATED APPLICATIONS

This application claims priority to Italian Patent Application No. 102017000118558, filed on Oct. 19, 2017, which application is hereby incorporated herein by reference.

TECHNICAL FIELD

The present invention relates generally to an electronic system and method, and, in particular embodiments, to a pulse width modulation (PWM) circuit, corresponding device and method.

BACKGROUND

A demand exists in certain application areas (e.g., the automotive market) for switching amplifiers such as class-D audio amplifiers with operating frequencies increased from current values such as 350 kHz towards higher values e.g., 2.2-2.4 MHz.

Higher operating frequencies may facilitate providing smaller systems with improved electromagnetic interference (EMI) spectrum emission characteristics.

Current 350 kHz class-D power audio amplifiers may include a pulse skipping control block to increase output power. U.S. Pat. No. 9,595,946 is exemplary of such a solution. Certain arrangements may also include a pulse skipping inhibition block in order to contain the EMI spectrum around known frequencies at the expense of a reduction in output power.

Conventional (analog) circuits are hardly able to meet the requirements related to (much) higher switching frequencies (e.g., about seven times higher) for class-D amplifiers.

SUMMARY

One or more embodiments may be applied to switching amplifiers, such as Class-D audio amplifiers.

One or more embodiments relate to an amplifier that switches at high switching frequencies, such as about seven times higher (e.g., higher than 2 MHz, such as between 2.2-2.4 MHz) than conventional operating frequencies (e.g., 350 kHz). A switching Class-D amplifier may be exemplary of such an amplifier.

One or more embodiments may relate to a corresponding method.

One or more embodiments may rely on a structure mixing analog features with a digital structure (e.g., digital components) in order to address issues related to, e.g., limitations in the slew rate of certain analog circuits such as operational amplifiers (op-amps).

In addition to providing improved performance, one or more embodiments may facilitate the adoption of a simple and compact structure.

One or more embodiments may provide both pulse skipping control and pulse skipping inhibit functions within a single circuit, e.g., by simply switching between different reference voltages.

One or more embodiments make it possible to generate a carrier waveform for a PWM modulator which facilitates a good, controlled near-clipping behavior also in systems operating with a high clock frequencies (e.g., in excess of 2 MHz) with timing precision and robustness in respect of temperature and process variations.

One or more embodiments may rely on simple threshold variations to obtain with a same circuit accurate pulse skipping inhibit. This may facilitates achieving controlled EMI characteristics in the PWM spectrum. In one or more embodiments achieving controlled EMI characteristics in the PWM spectrum may be obtained while avoiding additional circuits and facilitating high accuracy with high clock frequencies.

One or more embodiments are adapted for use in high-quality, high-frequency class-D audio systems with the capability of facilitating good clipping behavior and, if desired, control of EMI emissions in operating conditions.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

Figure 1:
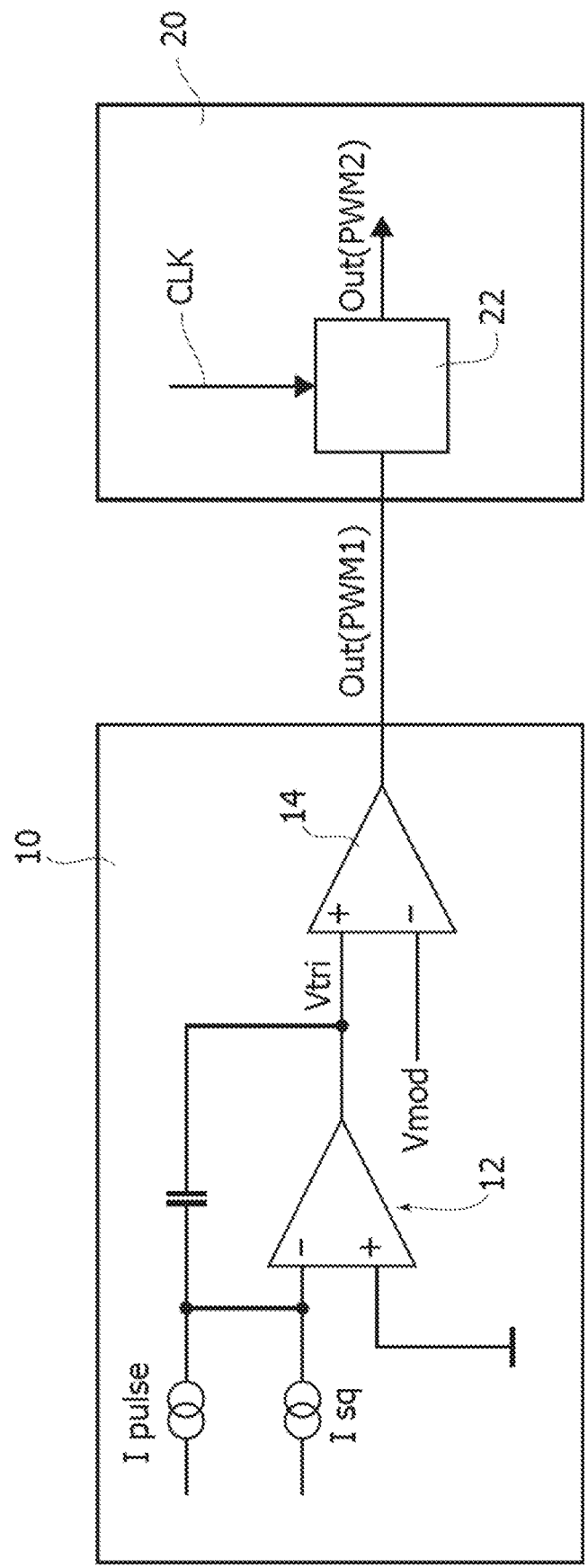
FIG. 1 is an exemplary diagram of a circuit involving pulse width modulation (PWM)

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

By way of introduction to the concept of "pulse skipping", one may note that, in order to achieve a high output signal dynamics, certain PWM modulators contemplate the possibility for the duty cycle to reach values such as 100% and 0%.

The designation duty cycle applies to the fraction of the period of a pulsed signal (the period being the time for the signal to complete an on-and-off cycle) where the signal is "on," namely active, that is:

$$D = PW/T \times 100\% \qquad (1)$$

where D is the duty cycle, T is the (total) period, and PW is the pulse width (pulse active time) or "on" time.

As a result of the duty cycle reaching extreme values such as 100% and 0% the switching frequency (Fsw), near clipping, may decrease by a factor 2, 4 and so on and switching may even be discontinued over the whole interval over which the output voltage is in a saturation state.

This phenomenon is known as "pulse skipping."

The behavior in the vicinity of and at saturation (clipping) may play a significant role in a switching PWM modulator (e.g., for audio applications).

In order to avoid an anomalous behavior, e.g., in those systems contemplating a high feedback factor, pulse skipping should desirably be "optimized," namely confined to take place as close to the saturation thresholds as possible.

The frequency spectrum (e.g., FFT) of PWM modulated signals before pulse skipping exhibits a substantially regular harmonic content, with peaks at the switching frequency and multiples thereof. In the presence of pulse skipping, the switching "bursts" generate tones also at zones different from the switching frequency and the multiples thereof, possibly affecting also the frequency domain below the switching frequency Fsw.

In certain systems, EMI issues suggest that a fixed switching frequency is maintained also in the presence of clipping. For that reason, certain PWM systems contemplate a "pulse skipping inhibition" circuit which is associated to the "pulse skipping optimization" circuit discussed previously.

The block diagram of FIG. 1 is exemplary of a switching circuit (e.g., a PWM modulator) comprising a first circuit block 10 intended to provide "optimized" clipping behavior and a second circuit block 20 intended to provide a pulse skipping inhibit function.

In some embodiments, the circuit block 10 may correspond to the solution disclosed in U.S. Pat. No. 9,595,946.

Briefly, the circuit block 10 may comprise a conventional PWM modulator, where a triangular carrier waveform Vtri is generated via an integrator 12 driven via a square (rectangular) wave Isq.

A PWM-modulated output signal Out(PWM1) is obtained by comparing at a comparator 14 the carrier signal Vtri carrier (from the integrator 12) with a modulating signal Vmod.

In proximity to clipping, small variations in the modulating signal Vmod (possibly due to noise) may result in a pulse being "skipped," which may be the source of instability and undesirable chaotic behavior near clipping. As exemplified in U.S. Pat. No. 9,595,946, this issue can be addressed by superposing to the carrier signal Isq a pulsed signal Ipulse applied to the input of the integrator 12 thus giving rise to narrow "steeper" pulses which, in near-clipping conditions, force switching.

Such an approach may be regarded as corresponding to a reduction of the gain of the modulator intended to render the discontinuity arising at that point less critical.

The pulse Ipulse may thus take the form of a short, spike-like, current pulse added in a synchronized manner to the square (rectangular) clock waveform Isq.

The circuit block 20 may comprise a pulse injector configured to sense a missing pulse which was "skipped" in the output signal Out(PWM1) of the modulator 10 and add it in a final output signal Out(PWM2).

It is noted that such an added signal will expectedly exhibit a slight delay with respect to the corresponding transition in the clock signal CLK.

This may represent one of the issues affecting an arrangement as exemplified in FIG. 1 if the PWM frequency is increased from, e.g., about 300 kHz to, e.g., values in excess of 2 MHz, as currently contemplated for various applications.

Other issues may be related to the slew rate of the integrator 12, which produces the triangular carrier in conjunction with the effect of the second pole therein and/or limitations related to current consumption which may adversely affect the capability of providing a pulse for controlling adequately pulse skipping. These factors, in conjunction with the possible delay of the pulse skipping inhibition action (circuit block 20) as discussed previously, may adversely affect the spectrum of the final output signal Out(PWM2).

Figure 2:
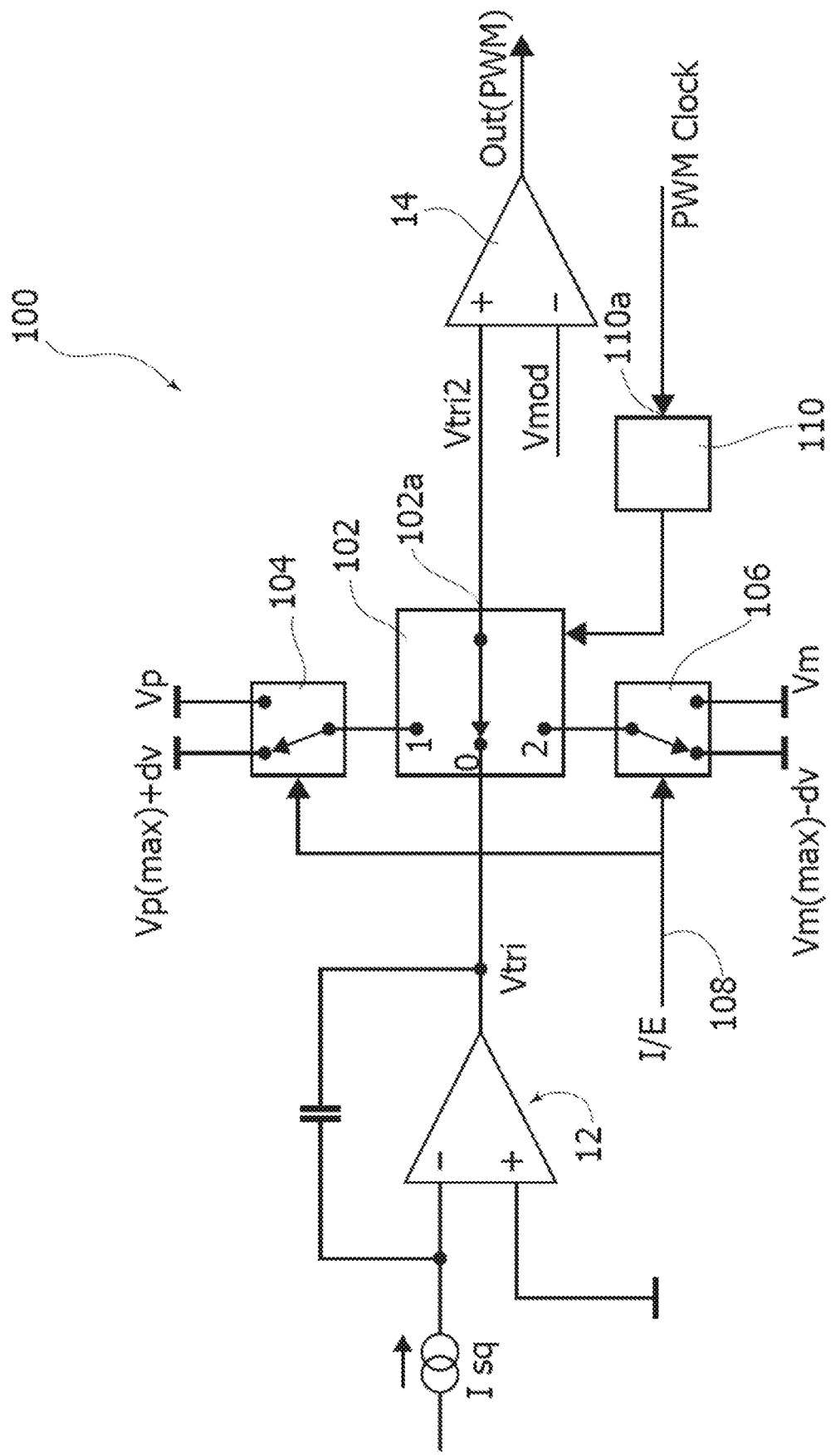
FIG. 2 is a circuit diagram exemplary of embodiments.

One or more embodiments may address these issues by resorting to a circuit as exemplified in FIG. 2.

In FIG. 2 parts or elements like parts or elements already discussed in connection with the FIG. 1 are indicated with like references. A corresponding description will not be repeated here for brevity.

The circuit of FIG. 2 is thus again configured for receiving, at one (e.g., inverting) input of the comparator 14, the modulating signal Vmod and producing (in a manner known per se) a PWM modulated signal Out(PWM) by comparing the modulating signal Vmod with a carrier signal Vtri2. Such a carrier signal may again be produced starting from a square wave input (e.g., current) signal Isq having rising and falling edges and by producing from the square (rectangular) wave input signal Isq (e.g., via integration at the integrator 12) a triangular wave (e.g., voltage) signal Vtri comprising alternating peaks and valleys.

In one or more embodiments as exemplified in FIG. 2, the signal Vtri can be applied to a circuit portion indicated 100 (to be discussed in the following), active between the circuit block 12 (integrator) and the circuit block 14 (comparator) to generate the carrier signal Vtri2 from the triangular wave signal Vtri.

In some embodiments, the circuit portion 100 is configured for modifying the signal Vtri by forcing the peaks and valleys of the signal to certain upper and lower reference values, with such modifying/forcing being adapted to be effected selectively (as a result of the occurrence of certain conditions), with the further optional capability for the circuit portion 100 to select a first forcing mode (pulse skipping optimization) and a second forcing mode (pulse skipping inhibit), where a first and a second value can be chosen for the upper and lower reference values, respectively.

By comparing the circuit of FIG. 2 with the circuit of FIG. 1 one may note that the pulse generator Ipulse at the input of the integrator 12 is no longer present in the circuit of FIG. 2.

In one or more embodiments, in the circuit of FIG. 2, the function of providing (e.g., voltage) pulses at the vertexes (peaks and valleys) of the waveform Vtri is implemented by using a switch 102 in the circuit portion 100.

In one or more embodiments as exemplified herein, the switch 102 comprises an output node 102a coupled to the input of the comparator 14 to provide the signal Vtri2 as a signal selected out of three possible options applied to three inputs to the switch 102, these inputs being labeled "0," "1," and "2," respectively.

The input "0" corresponds to the output from the integrator 12, which carries triangular waveform signal Vtri.

The input "1" is obtained from a circuit block 104, which in turn comprises a switch that may selectively couple, over a certain forcing time interval, to either one of two "higher" reference (e.g., DC voltage) levels Vp and Vp(max)+dv.

The input "2" is obtained from a circuit block 106, which in turn comprises a switch that may selectively couple, over a certain forcing time interval, to either one of two "lower" reference (e.g., DC voltage) levels Vm and Vm(max)−dv.

These reference levels may be obtained from conventional signal (e.g., voltage) sources, not shown in the figures.

As discussed in the following, these reference levels may be regarded as corresponding to some sort of upper and lower "end of scale" reference values to which the input triangular signal Vtri may be forced upward (to Vp or, alternatively, Vp(max)+dv) or downward (to Vm or, alternatively, Vm(max)−dv), over a certain forcing time interval (that is, not merely as instantaneous pulses) in order to provide pulse skipping control/pulse skipping inhibit functions.

As exemplified in FIG. 2, the circuit blocks 104, 106 operate under the control of a pulse skipping inhibit/enabled signal I/E (operation mode selection) obtained over a line 108 from a source (not visible in the figures), according to principles known per se (see also U.S. Pat. No. 9,595,946).

Reference no in FIG. 2 indicates a timing generator that receives the PWM clock signal (e.g., Isq, generated in any conventional manner) over a line 110a, e.g., with a 50% duty cycle.

Figure 3:
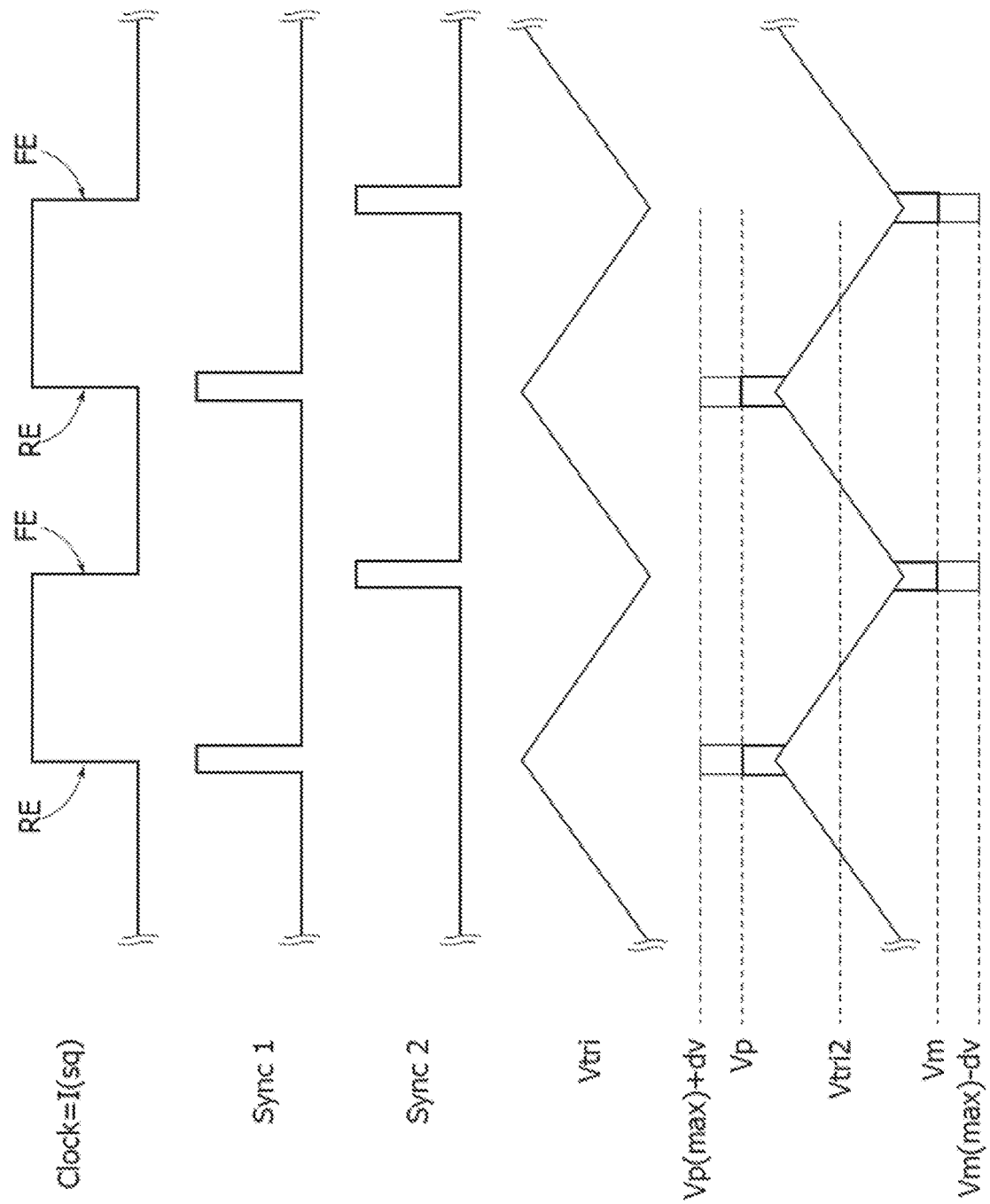
FIG. 3 shows a time diagram of signals which may occur in embodiments.

In one or more embodiments, as exemplified in the timing diagram of FIG. 3, the switch 102 may be controlled by the timing generator no based on three clocking signals, comprising:

the clock signal (PWM clock), e.g., with a duty cycle=50%, having rising edges RE and falling edges FE, as shown in FIG. 3;

a first square wave (pulse) signal Sync1, which goes to a logic level "1" at the rising edges RE of the clock signal for a certain time duration (e.g., centered temporarily on the rising edges RE), and which may be selected to correspond to a smallest desired duty cycle value for the output signal, as shown in FIG. 3; and a second square wave (pulse) signal Sync2, which goes to a logic level "1" at the falling edges FE of the clock signal for a time duration (e.g., centered temporarily on the falling edges FE), and which may be selected to correspond to the smallest desired duty cycle value for the output signal, as shown in FIG. 3.

By observing the diagrams FIG. 3, one may note that the square wave signals Sync1 and Sync2 comprise pulses of a certain time duration (and not merely instantaneous spike-like pulses) with that time duration possibly dictated by a smallest desired duty cycle value for the PWM modulated output signal Out(PWM), e.g., selected equal to the pulse width (pulse active time) or "on" time (PW in Equation 1) corresponding to a smallest desired duty cycle value for Out(PWM).

FIG. 3 also shows a corresponding possible time behavior of Vtri and Vtri2.

In one or more embodiments, the switch 102 may thus take:

the "0" position (carrier transfer setting), with Vtri applied to the comparator 14 as Vtri2, as a result of both signals Sync1 and Sync2 being equal to zero, namely with Sync1=Sync2=0;

the "1" position (first carrier forcing setting), as a result of Sync1=1 and Sync2=0, so that the output from the block 104 is coupled to the comparator 14, with Vtri2 resulting from Vtri being forced "upward" to either one of the upper reference values Vp or Vp(max)+dv (e.g., DC voltages) as a function of the position taken by the switch in the block 104;

the "2" position (second carrier forcing setting), as a result of Sync1=0 and Sync2=1, so that the output from the block 106 is coupled to the comparator 14, with Vtri2 resulting from Vtri being forced "downward" to either one of the lower reference values Vm or Vm(max)−dv (e.g., DC voltages) as a function of the position taken by the switch in the block 106.

As exemplified in FIG. 3, while corresponding to Vtri when Sync1=Sync2=0, as a result of Sync1 or Sync2 going to 1, the signal Vtri2 will be "modified" with respect to triangular signal Vtri input to the circuit portion 100 insofar as the vertexes (peaks and valleys) of Vtri will have superposed pulses (upward and downward, respectively) of controlled shape and amplitude over the duration of the forcing time intervals set by Sync1 or Sync2.

The modified triangular-with-superposed-pulses waveform of Vtri2 resulting from selectively forcing the alternating peaks and valleys of the triangular wave carrier signal to upper and lower reference values will thus exhibit (as a function of the value of pulse skipping optimization/inhibit signal I/E on the line 108):

with the switches 104, 106 connected to Vp and Vm, first reference values Vp (positive) or Vm (negative), or with the switches 104, 106 connected to Vp(max)+dv and Vm(max)−dv, second reference values Vp(max)+dv (positive) or Vm(max)−dv (negative), respectively.

In one or more embodiments, the first reference values Vp and Vm, may be selected to be within the largest expected swing of the modulating signal Vmod, that is smaller (in modulus) of the highest and lowest expected values for Vmod.

In one or more embodiments, this first option will result in a first forcing mode to produce in Vtri2 upper and lower reference values selected at first values Vp, Vm lying within the modulating signal swing between highest and lowest values.

In that way, the area near saturation of the PWM signal will be made (more) regular, especially in systems with feedback, reducing the gain of the PWM modulator in that zone.

In fact, with Vmod reaching values in excess of Vp or lower than Vm the duty cycle will reach corresponding values 100% or 0%, thus achieving a large output signal dynamics, and performing a pulse skipping optimization function.

In one or more embodiments, in addition to being larger (in modulus) of both Vp and Vm, the second reference values Vp(max)+dv and Vm(max)−dv may be selected to be in excess of the largest expected swing of the modulating signal Vmod, that is larger (in modulus) of the highest and lowest expected values for Vmod.

In one or more embodiments, this second option will result in a second forcing mode to produce in Vtri2 upper and lower reference values selected at second values (Vp(max)+dv, Vm(max)−dv) lying outside the modulating signal swing between highest and lowest values.

These may serve the purpose of avoiding that the duty cycle may reach values such as 100% or 0%, thereby maintaining the nominal clock frequency with a lowest duty cycle value as set by the duty cycle of the signals Sync1 and Sync2, thus performing a pulse skipping inhibit function.

Figure 4:
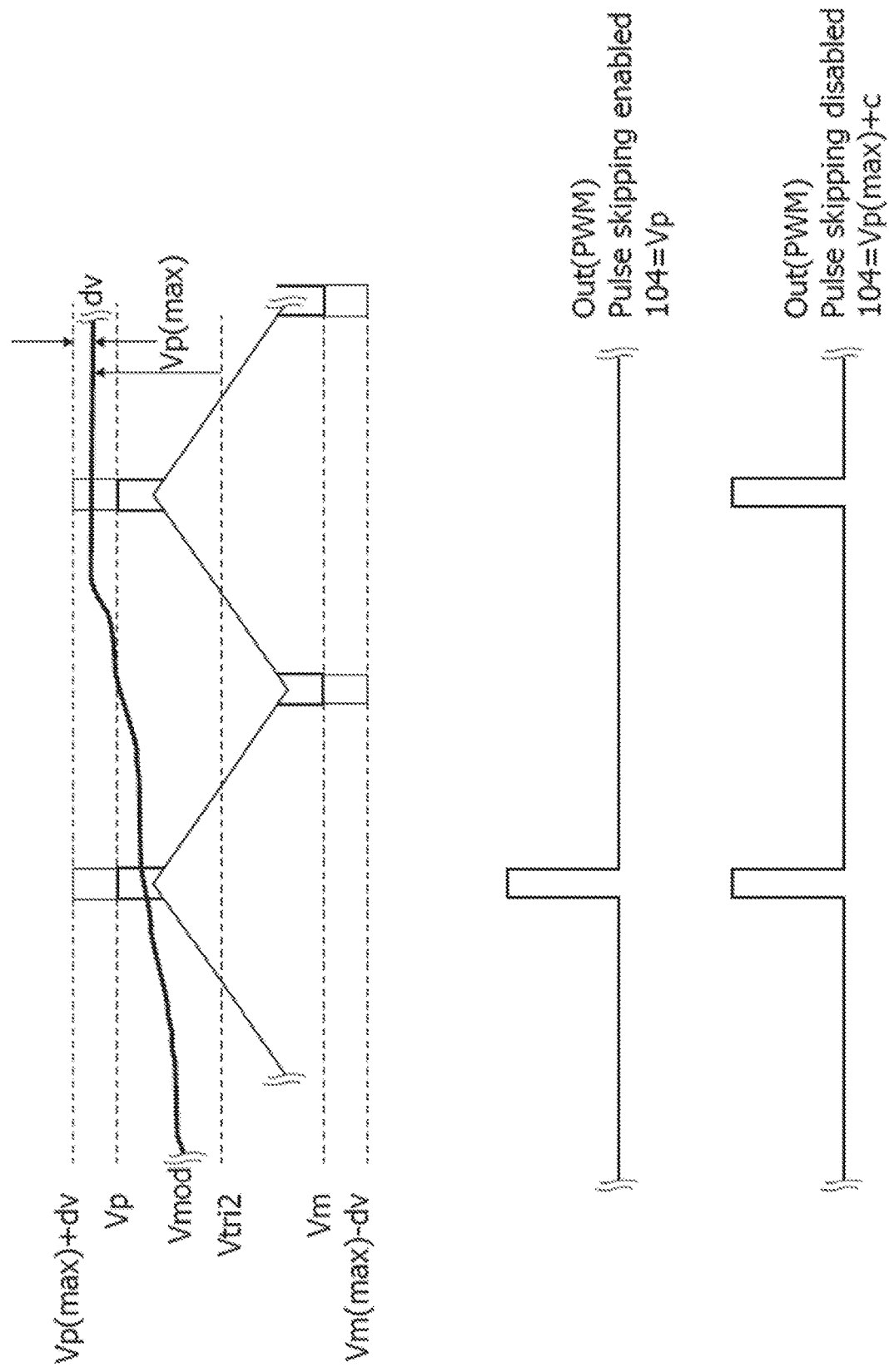
FIG. 4 shows a time diagram of signals which may occur in embodiments.

This type of operation is exemplified in FIG. 4, where a top portion of FIG. 4 shows a possible behavior of the signal Vtri2 with a possible time behavior of the modulating signal Vmod also shown for direct reference.

A bottom portion of FIG. 4 shows possible time behavior of the PWM modulated output signal Out(PWM):

with pulse skipping enabled and optimized (with the switch 104 switched on Vp), and with pulse skipping disabled/inhibited, with the switch 104 switched on Vp(max)+dv.

A similar result will be provided with the switch 106 on Vm and Vm(max)−dv (by taking into account the possible reversed polarity).

Figure 5:
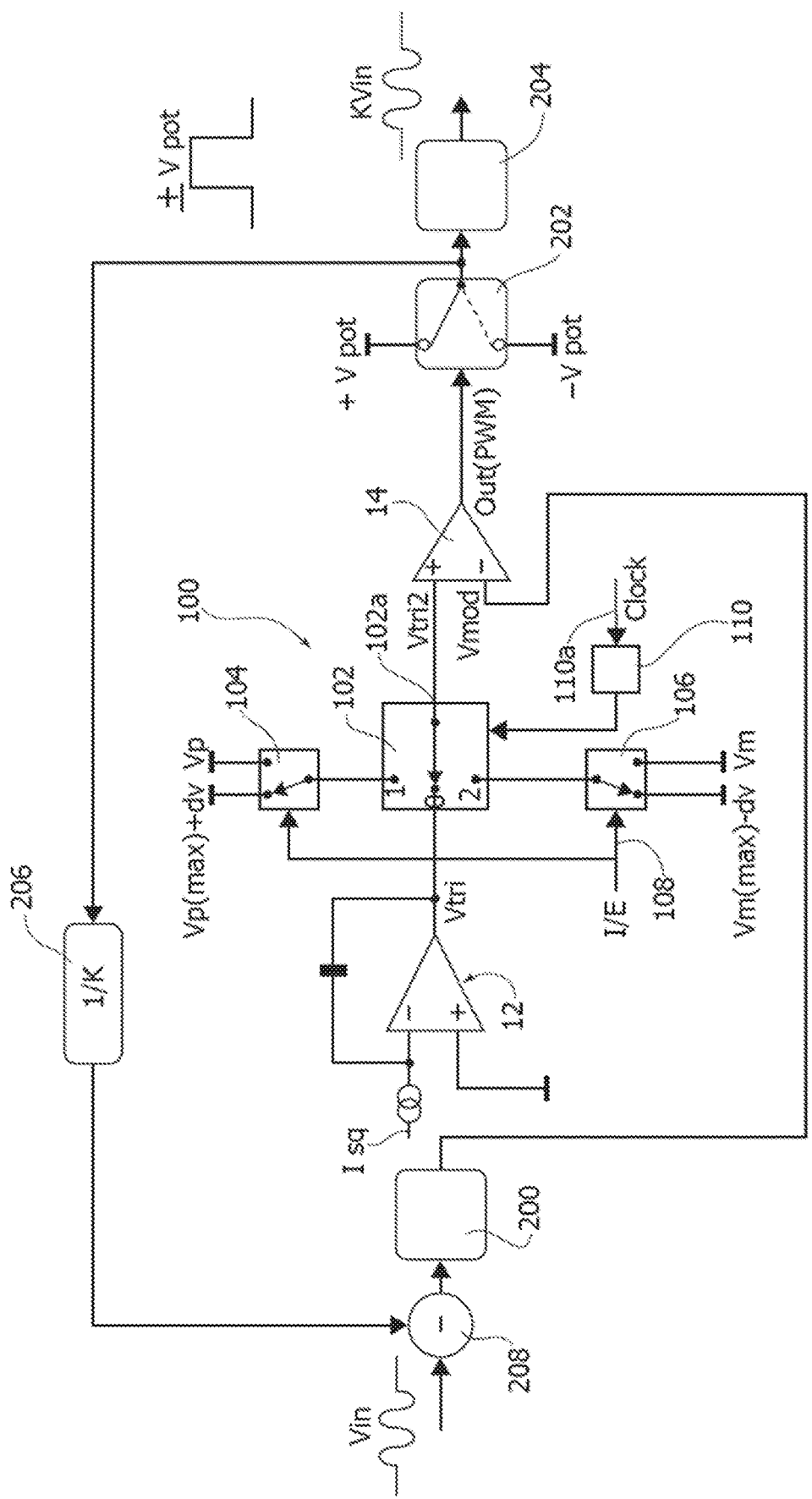
FIG. 5 is a block diagram of a device according to embodiments.

The block diagram of FIG. 5 is exemplary of the possible inclusion of a circuit as exemplified in FIG. 2 in a high-frequency PWM power circuit (e.g., a class-D audio amplifier) receiving an input signal Vin and comprising an input integrator 200 and where the output signal Out(PWM) from the comparator 14 is fed to a power switch 202 switching between two values +Vpot and −Vpot. The diagram of FIG. 5 also shows a (negative) feedback path 206 with gain 1/K to be subtracted at an input node 208 from the input signal Vin input to the integrator 200. The output from the switch 202 can be applied to an output LC (reconstruction) filter 204 to provide an output amplified signal KVin (that is the input signal Vin having a gain K applied thereto).

As for the rest, operation of an arrangement as exemplified in FIG. 5 (a class-D amplifier) is otherwise conventional in the art, thus making it unnecessary to provide a more detailed description herein.

In one or more embodiments, a circuit may comprise:

a first circuit block (e.g., the integrator 12) configured for receiving a square wave input signal (e.g., Isq) having rising and falling edges (see e.g., RE and FE in FIG. 3) and producing from the square wave input signal (e.g., by integration) a triangular wave signal (e.g., Vtri, comprising alternating peaks and valleys), a second circuit block (e.g., the comparator 14) configured for receiving a modulating signal (e.g., Vmod) and producing a PWM modulated signal (e.g., Out(PWM)) by comparing the modulating signal with a carrier signal (e.g., Vtri2), a switching circuit block (e.g., 100) between the first circuit block and the second circuit block, wherein the switching circuit block includes reference inputs (e.g., 104 and 106) configured for receiving reference signals having upper (e.g., Vp, Vp(max)+dv) and lower (e.g., Vm; Vm(max)−dv) reference values and is selectively (e.g., as function of Sync1, Sync2 and, possibly I/E) switchable (102) between:

a carrier transfer setting (e.g., position 0 of the switch 102), where the switching circuit block couples the first circuit block to the second circuit block to transfer thereto the triangular wave signal as the carrier signal, at least one carrier forcing setting (e.g., positions 1 and 2 of the switch 102) where the switching circuit block applies to the second circuit block the reference signals by forcing the (alternating peaks and valleys of the) carrier signal to the upper (e.g., Vp or Vp(max)+dv, depending on the setting of 104 as controlled by the I/E signal) and lower (e.g., Vm or Vm(max)−dv, depending on the setting of 106 as controlled by the I/E signal) reference values, respectively.

In one or more embodiments:

the second circuit block may be configured for receiving a modulating signal (e.g., Vmod) having a modulating signal swing between highest and lowest modulating signal values, the switching circuit block:

i) includes reference inputs (e.g., 104 and 106) configured for receiving reference signals having first upper (e.g., Vp) and first lower (e.g., Vm) reference values lying within the modulating signal swing as well as second upper (e.g., Vp(max)+dv) and second lower (e.g., Vm(max)−dv) reference values lying outside the modulating signal swing, ii) is selectively switchable (e.g., at the level of switches 104 and 106) between:

a first carrier forcing setting (see e.g., signal E=enable on line 108), where the switching circuit block applies to the second circuit block the reference signals with the first upper and first lower reference values, a second carrier forcing setting (see e.g., signal I=inhibit or disable on line 108), wherein the switching circuit block applies to the second circuit block the reference signals with the second upper and second lower reference values.

In one or more embodiments:

the second circuit block may be configured for producing the PWM modulated signal with a lowest value for the PWM duty cycle wherein the PWM modulated signal has a lowest pulse active time at the selected lowest value for the duty cycle, the switching circuit block is selectively switchable to the at least one carrier forcing setting over carrier forcing intervals equal to the lowest pulse active time.

One or more embodiments may comprise a clock circuit block (e.g., 110) sensitive to the rising and falling edges (RE, FE) of the square wave input signal, the clock circuit block may be configured for driving the switching circuit block to switch between the carrier transfer setting and the at least one carrier forcing setting at the rising and falling edges of the square wave input signal.

In one or more embodiments, the clock circuit block may be configured for driving the switching circuit block to switch to the at least one carrier forcing setting over carrier forcing intervals centered around the rising and falling edges of the square wave input signal.

A device according to one or more embodiments may comprise:

a PWM modulation circuit (e.g., 12, 14, 100) according to one or more embodiments producing a PWM modulated signal, an input circuit block (e.g., 200, 208) configured for receiving an input signal (e.g., Vin) and providing to the PWM modulation circuit the modulating signal as a function of the input signal (Vin), a switching power stage (e.g., 202) driven by the PWM modulated signal from the PWM modulation circuit, and a low-pass filter circuit (e.g., 204) receiving a switching power signal from the switching power stage and producing therefrom an amplified replica (e.g., KVin) of the input signal.

One or more embodiments may comprise a feedback path (e.g., 206) between the switching power stage and the input circuit block.

In one or more embodiments, a method may comprise:

receiving a modulating signal, producing a PWM modulated signal by comparing the modulating signal with a carrier signal, the carrier signal produced by receiving a square wave input signal having rising and falling edges and producing (e.g., via integration) from the square wave input signal a triangular wave signal (comprising alternating peaks and valleys), and selectively forcing the (alternating peaks and valleys of the) carrier signal to upper and lower reference values, respectively, over carrier forcing intervals (see, e.g., the duration of the pulses of Sync1 and Sync2 in FIG. 3 at the rising (e.g., RE) and falling edges (e.g., FE) of the square wave input signal), the carrier forcing intervals optionally centered around the rising and falling edges of the square wave input signal.

In one or more embodiments, the modulating signal may have a modulating signal swing between highest and lowest modulating signal values, wherein selectively forcing the carrier signal to upper and lower reference values may comprise:

a first carrier forcing mode wherein the upper and lower reference values are selected at first values (e.g., Vp, Vm) lying within the modulating signal swing, and a second carrier forcing mode wherein the upper and lower reference values are selected at second values (e.g., Vp(max)+dv, Vm(max)−dv) lying outside the modulating signal swing.

One or more embodiments may comprise:

selecting a lowest value for the duty cycle of the PWM modulated signal where the PWM modulated signal has a lowest pulse active time at the selected lowest value for the duty cycle, selecting the duration of the carrier forcing intervals to the upper and lower reference values equal to the lowest pulse active time.

Without prejudice to the underlying principles, the details and embodiments may vary, even significantly, with respect to what has been described by way of example only without departing from the extent of protection. The extent of protection is defined by the annexed claims.

What is claimed is:

1. A circuit comprising:
   a first circuit block configured to receive a square wave input signal having rising and falling edges and to produce a triangular wave signal from the square wave input signal;
   a second circuit block configured to receive a modulating signal and to produce a pulse width modulated signal by comparing the modulating signal with a carrier signal;
   a switching circuit block coupled between the first circuit block and the second circuit block, wherein the switching circuit block comprises reference inputs configured to receive reference signals having upper and lower reference values, wherein the switching circuit block is selectively switchable between:
      a carrier transfer setting in which the switching circuit block couples the first circuit block to the second circuit block to transfer the triangular wave signal as the carrier signal, and
      a carrier forcing setting in which the switching circuit block applies to the second circuit block the reference signals by forcing the carrier signal to respective upper and lower reference values; and
   a clock circuit block sensitive to the rising and falling edges of the square wave input signal, the clock circuit block configured to drive the switching circuit block to switch between the carrier transfer setting and the carrier forcing setting at the rising and falling edges of the square wave input signal.

2. The circuit of claim 1, wherein:
   the modulating signal comprises a modulating signal swing between highest and lowest modulating signal values;
   the upper and lower reference values comprise first upper and first lower reference values lying within the modulating signal swing, and second upper and second lower reference values lying outside the modulating signal swing; and
   the carrier forcing setting comprises:
      a first carrier forcing setting in which the switching circuit block applies to the second circuit block the reference signals with the first upper and first lower reference values, and
      a second carrier forcing setting in which the switching circuit block applies to the second circuit block the reference signals with the second upper and second lower reference values.

3. The circuit of claim 1, wherein the second circuit block is configured to produce the pulse width modulated signal with a lowest value of duty cycle, wherein the pulse width modulated signal has a lowest pulse active time at the lowest value of duty cycle, and wherein the switching circuit block is selectively switchable to the carrier forcing setting over carrier forcing intervals equal to the lowest pulse active time.

4. The circuit of claim 1, wherein the clock circuit block is configured to drive the switching circuit block to switch to the carrier forcing setting over carrier forcing intervals centered around the rising and falling edges of the square wave input signal.

5. The circuit of claim 1, wherein the pulse width modulated signal operates at a frequency higher than 2 MHz.

6. A device, comprising:
   a first circuit block configured to receive a square wave input signal having rising and falling edges and produce from the square wave input signal a triangular wave signal;
   a second circuit block configured to receive a modulating signal and produce a pulse width modulated signal by comparing the modulating signal with a carrier signal;
   a switching circuit block coupled between the first circuit block and the second circuit block, wherein the switching circuit block comprises reference inputs configured to receive reference signals having upper and lower reference values, wherein the switching circuit block is selectively switchable between:
      a carrier transfer setting in which the switching circuit block couples the first circuit block to the second circuit block to transfer the triangular wave signal as the carrier signal, and
      a carrier forcing setting in which the switching circuit block applies to the second circuit block the reference signals by forcing the carrier signal to respective upper and lower reference values;
   a clock circuit block sensitive to the rising and falling edges of the square wave input signal, the clock circuit block configured to drive the switching circuit block to switch between the carrier transfer setting and the carrier forcing setting at the rising and falling edges of the square wave input signal;
   an input circuit block configured to receive an input signal and provide to the second circuit block the modulating signal as a function of the input signal;
   a switching power stage driven by the pulse width modulated signal; and
   a low-pass filter circuit configured to receive a switching power signal from the switching power stage and produce an amplified replica of the input signal.

7. The device of claim 6, further comprising a feedback path coupled between the switching power stage and the input circuit block.

8. The device of claim 7, wherein the input circuit block is configured to provide to the second circuit block the modulating signal by subtracting a feedback value of the feedback path from the input signal.

9. The device of claim 6, wherein the first circuit block comprises an amplifier having a feedback loop that comprises a capacitor.

10. The device of claim 6, wherein the device is a Class-D switching audio amplifier.

11. The device of claim 6, wherein:
the modulating signal comprises a modulating signal swing between highest and lowest modulating signal values;
the upper and lower reference values comprise first upper and first lower reference values lying within the modulating signal swing, and second upper and second lower reference values lying outside the modulating signal swing; and
the carrier forcing setting comprises:
   a first carrier forcing setting in which the switching circuit block applies to the second circuit block the reference signals with the first upper and first lower reference values, and
   a second carrier forcing setting in which the switching circuit block applies to the second circuit block the reference signals with the second upper and second lower reference values.

12. The device of claim 11, wherein the second circuit block is configured to produce the pulse width modulated signal with a lowest value of duty cycle, wherein the pulse width modulated signal has a lowest pulse active time at the lowest value of duty cycle, and wherein the switching circuit block is selectively switchable to the carrier forcing setting over carrier forcing intervals equal to the lowest pulse active time.

13. The device of claim 6, wherein the clock circuit block is configured to drive the switching circuit block to switch to the carrier forcing setting over carrier forcing intervals centered around the rising and falling edges of the square wave input signal.

14. A method, comprising:
receiving a modulating signal with a second circuit block;
producing a pulse width modulated signal by comparing the modulating signal with a carrier signal using the second circuit block, the carrier signal produced by receiving a square wave input signal having rising and falling edges and producing from the square wave input signal a triangular wave signal by using a first circuit block;
selectively forcing the carrier signal to upper and lower reference values, respectively, over carrier forcing intervals at the rising and falling edges of the square wave input signal by using a switching circuit block coupled between the first circuit block and the second circuit block; and
driving the switching circuit block to switch between a carrier transfer mode and a carrier forcing mode at the rising and falling edges of the square wave input signal using a clock circuit block sensitive to the rising and falling edges of the square wave input signal, wherein the switching circuit block couples the first circuit block to the second circuit block to transfer the triangular wave signal as the carrier signal, in the carrier transfer mode, and wherein the switching circuit block selectively forces the carrier signal to upper and lower reference values, respectively, in the carrier forcing mode.

15. The method of claim 14, wherein the carrier forcing intervals are centered around the rising and falling edges of the square wave input signal.

16. The method of claim 14, wherein the modulating signal has a modulating signal swing between highest and lowest modulating signal values, and wherein selectively forcing the carrier signal to upper and lower reference values comprises:
a first carrier forcing mode in which the upper and lower reference values are selected at first values lying within the modulating signal swing; and
a second carrier forcing mode in which the upper and lower reference values are selected at second values lying outside the modulating signal swing.

17. The method of claim 14, further comprising:
selecting a lowest value for a duty cycle of the pulse width modulated signal, wherein the pulse width modulated signal has a lowest pulse active time at the selected lowest value for the duty cycle; and
selecting a duration of the carrier forcing intervals to equal to the lowest pulse active time.

18. The method of claim 14, wherein the pulse width modulated signal operates at a frequency between 2.2 MHz and 2.4 MHz.

19. The method of claim 14, wherein producing the triangular wave signal from the square wave input signal comprises integrating the square wave input signal with an integrator circuit of the first circuit block, the integrator circuit comprising an amplifier having a feedback loop that comprises a capacitor.

* * * * *